United States Patent [19]

Kataoka et al.

[11] Patent Number: 5,306,934
[45] Date of Patent: Apr. 26, 1994

[54] SEMICONDUCTOR DEVICE WITH BURIED ELECTRODE

[75] Inventors: Yuzo Kataoka, Hiratsuka; Toshihiko Ichise; Keiji Ishizuka, both of Kawasaki; Tetsuo Asaba, Atsugi, all of Japan

[73] Assignee: Canon Kabushiki Kaisha, Tokyo, Japan

[21] Appl. No.: 823,604

[22] Filed: Jan. 17, 1992

Related U.S. Application Data

[63] Continuation of Ser. No. 708,217, May 31, 1991, abandoned.

[30] Foreign Application Priority Data

May 31, 1990 [JP] Japan ................................. 2-139622
Nov. 19, 1990 [JP] Japan ................................. 2-311593

[51] Int. Cl.$^5$ ........................ H01L 29/80; H01L 23/48
[52] U.S. Cl. ................................. 257/263; 257/260; 257/622; 257/773
[58] Field of Search ............... 357/34, 68, 67, 23.1, 357/22; 257/565, 622, 741, 773, 263, 260

[56] References Cited

U.S. PATENT DOCUMENTS 4,086,694  5/1978  U ............................................ 29/579
4,933,732  6/1990  Katoh et al. ......................... 357/34

FOREIGN PATENT DOCUMENTS 0306213  8/1989  European Pat. Off. ...... H01L 29/52
2621165  9/1976  Fed. Rep. of Germany ......... H01L 21/88
1534896  12/1978  United Kingdom ......... H01L 23/48

OTHER PUBLICATIONS

*Research Disclosure*, No. 291, Jul. 1988, pp. 497–498, "A Method For Forming Contacts To Buried Semiconductor Layers".

*Primary Examiner*—Mark V. Prenty
*Attorney, Agent, or Firm*—Fitzpatrick, Cella, Harper & Scinto

[57] ABSTRACT

A semiconductor device including a bipolar transistor, has a collector region including a first semiconductor region of the first conductivity type and a second semiconductor region of the first conductivity type having higher resistance than the first semiconductor region, a base region including a semiconductor region of the second conductivity type, and an emitter region including a semiconductor region of the first conductivity type. The semiconductor device further comprises a metal layer region for connecting the first semiconductor region and the collector electrode on the collector region provided within the second semiconductor region layer of the collector region.

1 Claim, 9 Drawing Sheets

SEMICONDUCTOR DEVICE WITH BURIED ELECTRODE

This application is a continuation of application Ser. No. 07/708,217, filed May 31, 1991 and now abandoned.

BACKGROUND OF THE INVENTION

1. Field of the Invention

This invention relates to a semiconductor integrated circuit device such as a memory, a photoelectric converting device, a signal processing device, etc. Such a device is with various electronic instruments, particularly with a semiconductor device having a specific feature in its electrode structure and a method for preparing the same.

2. Related Background Art

To describe the prior art, as an example, a vertical PNP (hereinafter abbreviated as V-PNP) transistor which has been used in recent years as a functional device for highly integrated semiconductor device may be mentioned, such as one having the structure shown in FIG. 1. In FIG. 1, the reference numeral 1 is a P-type silicon substrate. On the P-type silicon substrate 1 is formed an N+ buried layer 2, and on the N+ buried layer 2 is formed a collector region 5 comprising a P+ buried layer 3 and a P− well layer 4. Within the P− well layer 4 of the collector region 5 is formed an N− well layer 6, and further within the N− well layer 6 are formed a P+ layer 7 and an N+ layer 8 made apart from each other. Within the P− well layer 4 of the collector region 5 is formed a P+ layer 9 apart from the N− well layer 6. And, on the P+ layer 7, the N+ layer 8 within the N− well layer 6 and the P+ layer 9 within the P− well layer 4 are respectively formed an emitter electrode 10, a base electrode 11 and a collector electrode 12.

Around the collector region 5 as mentioned above, an N− epitaxial layer 13 is formed.

In the V-PNP transistor with such a structure, when the transistor actuation enters a saturation region (stage), leakage current may appear from the collector region 5 through the N-epitaxial layer 13 into the P-type silicon substrate 1, thereby forming a parasitic PNP transistor. For this reason, as shown in FIG. 2, there has been also known a transistor which has been made to have a constitution having a deep N+ layer 14 in contact with the N+ layer 2 and surrounding the collector region 5 formed within the N− epitaxial layer 13, and further in which the emitter grounding current amplification $\beta$ of the parasitic PNP transistor is reduced by biasing to the maximum potential. Thus, the leakage current to the P-type silicon substrate 1 can be reduced. The guard ring electrode 15 of the transistor is taken out from the N+ buried layer 2 through the N+ layer 14.

However, in the transistor of the type shown in FIG. 1 and FIG. 2, the current from the emitter electrode 10 flows into the P− well layer of the collector region 5 and the P+ buried layer 3, wherefrom it is taken out through the P+ layer 9 on the transistor surface at the collector electrode 12, and therefore the resistance of the P− well layer 4 becomes larger. Thus, the collector series resistance becomes larger as a whole. Further, when the collector series resistance becomes larger, the emitter grounding current amplification $\beta$ of a large current region becomes lower. While when the collec-tor region 5 is larger, there will occur an inconvenience that the device size becomes larger.

In the transistor shown in FIG. 2, because the N+ layer 14 is required to be provided within the N− (epitaxial) layer 13 around the collector region 5, the margins of the collector region 5 and the device separation region 16 are required to be sufficiently large due to the influence of the lateral spreading of the diffusion layer, and therefore the device size also becomes large in such a case. However, the junction capacity with the N+ layer 14 of the collector region 5 will be increased.

The technical task as described above is marked in the V-PNP transistor, and also in other functional devices, there is main electrode region (buried collector, buried base, buried emitter, buried source, buried drain, buried gate, etc.) within semiconductor substrate, and it is applicable similarly if a region for connecting electrically said electrode region to the electrode wiring on the substrate surface is required.

SUMMARY OF THE INVENTION

A primary object of the present invention is to provide a semiconductor device having improved characteristics over than in the prior art.

More specifically, the present invention has been accomplished in order to solve the technical task as described above, and its object is to provide a semiconductor device capable of great current actuation.

Another object of the present invention is to provide a semiconductor device including a bipolar transistor, having a collector region including a first semiconductor region of the first conductivity type and a second semiconductor region of the first conductivity type having higher resistance than said first semiconductor region, a base region including a semiconductor region of the second conductivity type, and an emitter region including a semiconductor region of the first conductivity type, said device comprising a metal layer region for connecting said first semiconductor region and the collector electrode on said collector region provided within said second semiconductor region layer of said collector region.

DETAILED DESCRIPTION OF THE PREFERRED EMBODIMENTS

In the following, preferred embodiments of the present invention are described.

An electrode structure to be used in a preferred embodiment of the present invention is an electrode region comprising a metal region with an aspect ratio buried within the semiconductor substrate.

The electrode structure of the present invention forms a part of the electrode wiring internally of the semiconductor substrate in the sense of series resistance reduction, and can be utilized for all functional devices, namely functional devices such as a field effect transistor, a bipolar transistor, a diffusion resistance, etc. Particularly, great effects will be exhibited when it is utilized for the collector electrode of a bipolar transistor, above all a V-PNP transistor.

(First embodiment)

Figure 2:
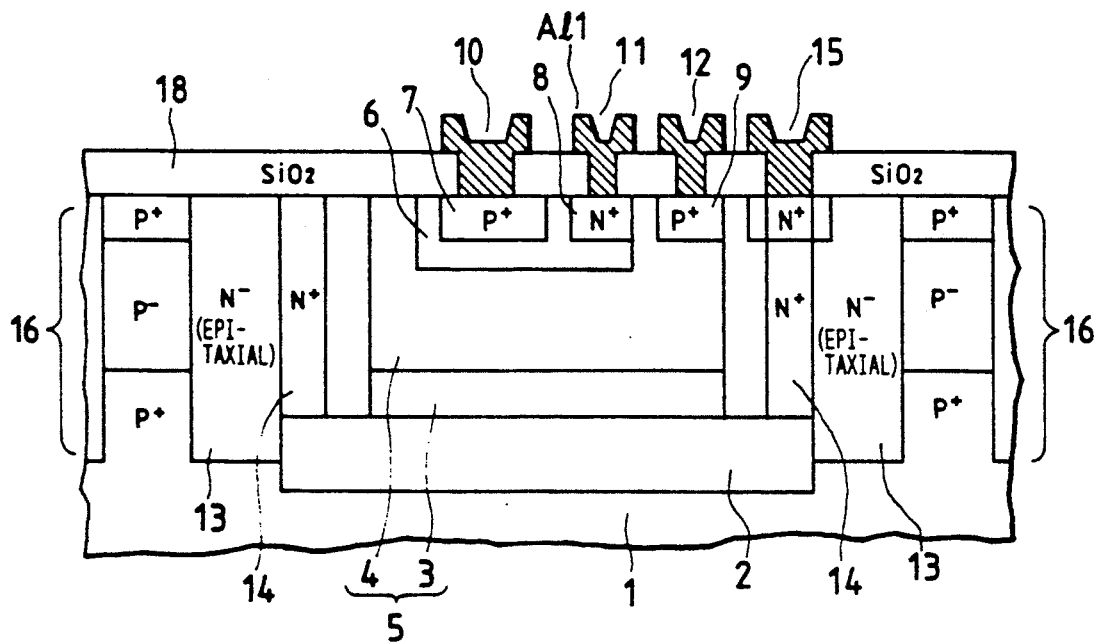
FIG. 2 is a schematic cross-sectional view showing another example of the bipolar transistor of the prior art.
Figure 3:
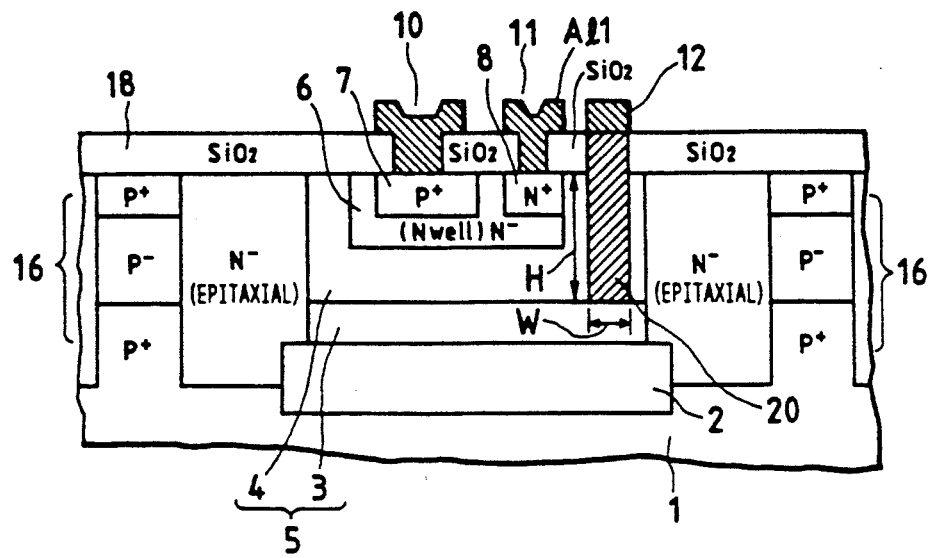
FIG. 3 is a schematic cross-sectional view showing the first embodiment of the present invention.

FIG. 3 is a schematic cross-sectional view showing a V-PNP transistor as its example. In FIG. 3, the same symbols are attached to the same constitutional portions as in the V-PNP transistor of the prior art shown in FIGS. 1 and 2, and description thereof is omitted.

Figure 1:
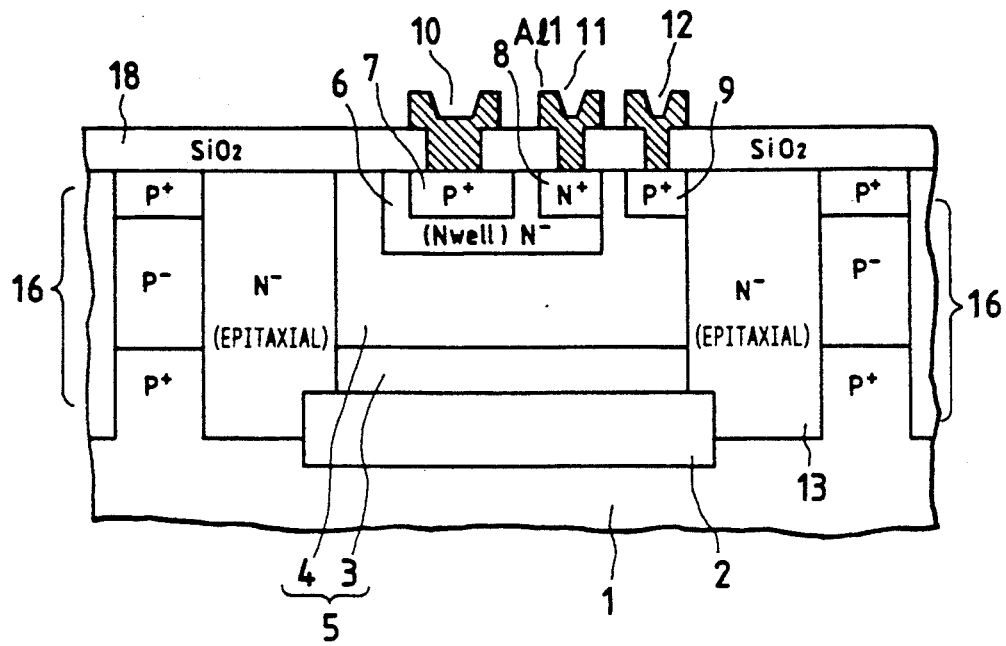
FIG. 1 is a schematic cross-sectional view showing an example of the bipolar transistor of the prior art.

In FIG. 3, the symbol 20 is a first electrode region comprising a metal as the electroconductive material. Here, W<H, with H/W being 1.0 or higher, preferably 2.0 or higher, optimally 3.0 or higher, whereby the area occupied by the collector electrode can be made smaller. The first electrode region 20 connects the P+ buried layer 3 in the collector region 5 to the collector electrode 12, and is formed here along the direction crossed at right angle as the crosslinking direction relative to the surface of the P-type silicon substrate 1 within the P− well layer 4 of the collector region 5 between the P+ buried layer 3, the collector electrode 12 and the interlayer insulation film 18. The P− well layer 4 has a higher resistance than the P+ buried layer. In the present embodiment, because the first wiring layer is in direct ohmic contact with the P+ buried layer 3, no impurity layer corresponding to the P+ layer 9 in the transistor of the prior art shown in FIGS. 1 and 2 is formed.

As the electroconductive material for forming such first electrode region 20, materials conventionally employed for electrodes or wiring in electronic devices or integrated circuit devices may be employed, such as semiconductors, and among them pure aluminum or an aluminum composed mainly of Al and containing silicon as a metal (Al-Si). Particularly, Al is preferred since it is inexpensive, has high electroconductivity, and also can form a dense oxidized film on the surface. Al has a number of advantages such that the inner portion is chemically protected to be stabilized and has good adhesion with Si, and therefore it can be preferably used when connecting well the P+ buried layer 3 to, for example, a collector electrode 12 comprising Al.

Thus, when the metal buried electrode is electrically connected to a predetermined portion only at the bottom of the groove, the whole side wall surface should be preferably covered with an insulation film.

On the other hand, when the metal buried electrode is insulated from a part of the side wall or the bottom of the groove, only said portion is covered with an insulation film.

Next, by referring to FIG. 4A to FIG. 4I, an example of the present invention is described.

Figure 4A:
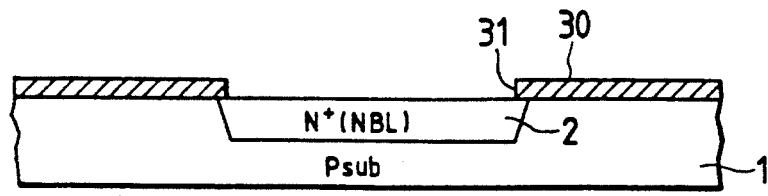
FIGS. 4A to 4I are schematic cross-sectional views for illustration of the preparation method of the semiconductor device according to the present invention.

1) First, for example, on the surface of a P-type silicon substrate 1 having an impurity concentration of $10^{14}$ to $10^{15}/cm^3$, a thermally oxidized film 30 comprising $SiO_2$ for diffusion mask, etc. is formed with a thickness of, for example, 0.8 to 1.0 mm, and then by patterning of the thermally oxidized film 30, openings 31 with predetermined sizes, shapes are formed. Next, with the thermally oxidized film 30 as the mask, an N-type impurity such as Sb (antimony) or As (arsenic) is introduced according to the ion injection method in the surface of the P-type silicon substrate 1 through the openings 31 of the thermally oxidized film 30, heat treatment is carried out to activate the N-type impurity simultaneously with diffusion thereof internally of the P-type silicon substrate 1. Thus, for example, an N+ buried layer 2 with a sheet resistance 40 to 120 $\Omega/\square$ is formed (FIG. 4A).

Figure 4B:
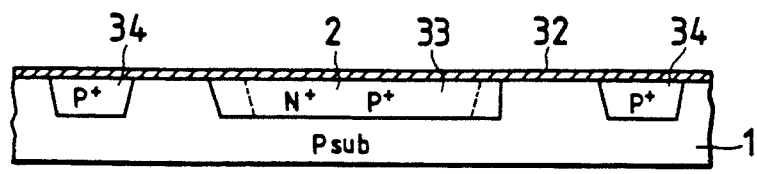

2) Next, after removal of the thermally oxidized film 30 as described above, a thermally oxidized film 32 comprising another $SiO_2$, etc. is formed with a thickness of, for example, 100 to 1000 Å. Resist patterning is effected on the thermally oxidized film 32. After incorporation of a P-type impurity of B (boron) into the N+ buried layer 2 and the region surrounding outside of the N+ buried layer B through the openings of the resist, heat treatment is applied after removal of the resist. By such heat treatment, the impurity as described above is activated simultaneously with diffusion internally of the substrate 1. Thus, P+ layers 33, 34 of, for example, 200 to 1000 $\Omega/\square$ are formed (FIG. 4B).

Figure 4C:
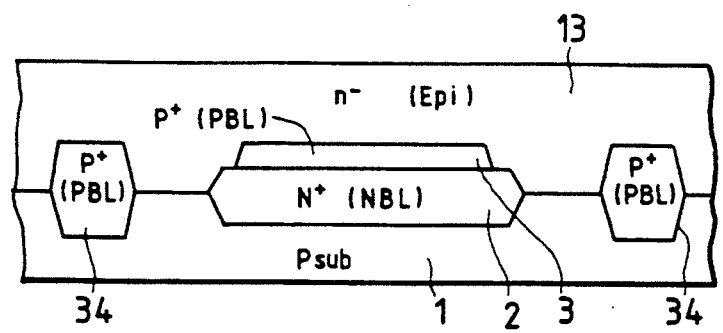

3) Next, after removal of all the oxidized films on the silicon substrate 1, an N-type epitaxial layer 13 is grown. The N-type epitaxial layer 13 should desirably have its thickness of about 1 to 5 μm, and a specific resistance of about 1 to 20 $\Omega/cm$. In such epitaxial growth, the impurity is diffused into the N-type epitaxial layer 13 from the P+ layers 33, 34. Particularly, from the N+ buried layer 2 (P+ layer 33), the N-type and P-type impurities are diffused into the N-type epitaxial layer 13. However, since the P-type impurity with greater coefficient of diffusion is diffused at a higher diffusion speed, a P+ buried layer 3 will be formed on the N+ buried layer 2 (FIG. 4C).

Figure 4D:
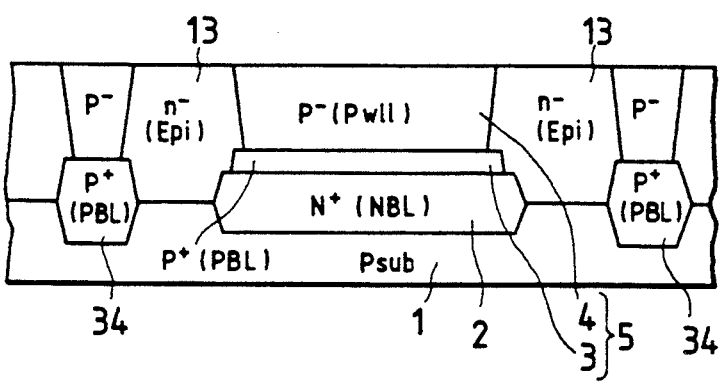
Figure 4E:
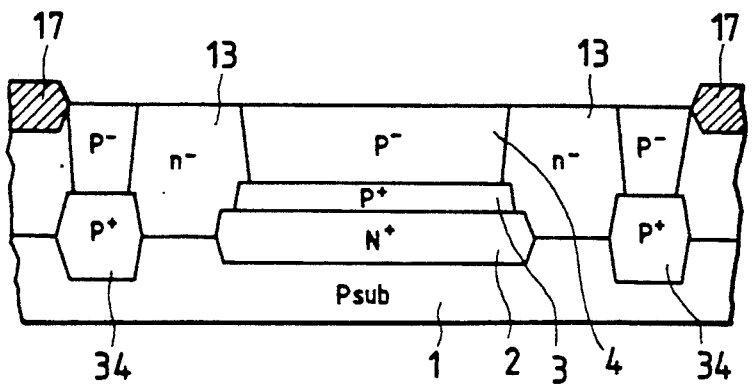

4) Next, a thermally oxidized film is formed on the surface of the N-type epitaxial layer as described above, the thermally oxidized film is subjected to patterning to form openings. After introduction of a P-type impurity such as B into the surface of the N-type epitaxial layer 13 according to ion injection through the openings with the thermally oxidized film as the mask, heat treatment is effected to have the impurity diffused internally of the N-type epitaxial layer 13. By such ion injection method and heat treatment, a P− well layer 4 is formed on the P+ buried layer 3 (FIG. 4D). The well layer 4 should desirably have a sheet resistance of about 2 to 10 $k\Omega/\square$.

5) Next, after removal of the thermally oxidized film from above the N-type epitaxial layer 13, a thermally oxidized film with a thickness of 100 to 1000 Å and a non-oxidizable film comprising $Si_3N_4$, etc. with a thickness of 1000 to 2000 Å are successively laminated. Next, on the laminated film, patterning is applied to form openings for device separation region as described below. And, according to the selective oxidation by use of the laminated film as the oxidation resistant mask, a field oxidized film region 17 for device separation (thickness 0.8 to 1.0 μm) and a device region for bipolar region are formed, and then the laminate film as described above is removed (FIG. 4E).

Figure 4F:
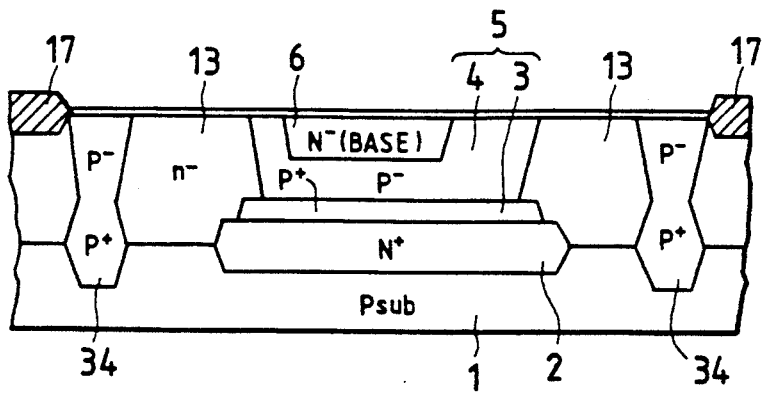

6) Next, a thermally oxidized film with a thickness of 200 to 1000 Å is formed on the $N^+$ type epitaxial layer 13 in the device region, the thermally oxidized film is applied with resist patterning to form openings for base formation of the bipolar transistor. Then, after introduction of an N-type impurity through the openings, the thermally oxidized film is removed and then heat treatment is effected. By doing so, a $N^-$ well layer (base) 6 is formed within the $P^-$ well layer 4. The formation conditions of the base layer 6, which depend on the characteristics of the bipolar transistor to be prepared, should desirably be made to have a sheet resistance of about 0.6 to 3 $k\Omega/\square$. (FIG. 4F).

7) Next, on the surface of the device region, a thermally oxidized film is formed, and the thermally oxidized film is applied with resist patterning to form openings at the positions corresponding to the $N^-$ well layer (base) 6 of the thermally oxidized film, namely the emitter formation region of the resist and the PN device separation region. Next, after introduction of a P-type impurity such as B, $BF_2$ etc. through these openings, the thermally oxidized film as the resist is removed.

Next, a thermally oxidized film is formed on the surface of the $N^-$ well layer (base) 6, the thermally oxidized film is applied with resist patterning to form openings for formation of the $N^+$ layer of the base contact. Next, after formation of an N-type impurity such as As, etc. though the openings according to the ion injection method, a thermally oxidized film as the resist is formed.

Figure 4G:
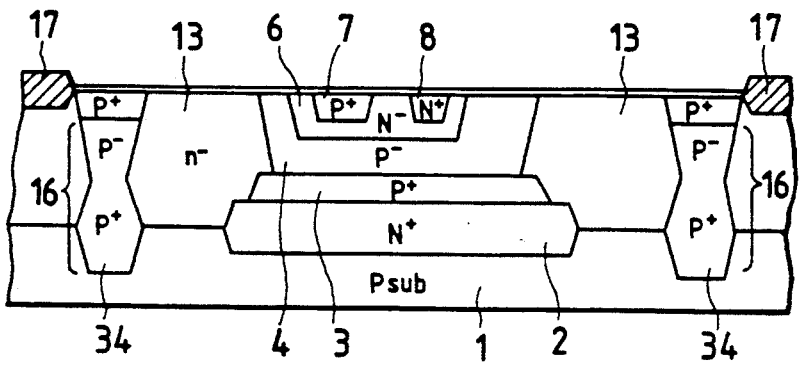

Then, the P-type impurity is activated and diffused by application of heat treatment to form the $P^+$ layer 7 and the $N^+$ layer 8 separately from each other at the upper portion of the $N^-$ well layer (base) 6 (FIG. 4G).

The ion injection conditions of the P-type impurity in this step and subsequent heat treatment conditions are determined depending on the characteristics of the bipolar transistor to be prepared.

8) Next, on the whole surface of the device region and the device separation, for example, BPSG (Borophospho silicate glass), etc. is deposited to a thickness of about 0.6 to 1.0 μm according to the CVD method, annealing is applied to form an interlayer insulation film 18.

9) Next, a thermally oxidized film is formed on the interlayer insulation film 18, and the thermally oxidized film is applied with a resist patterning to form openings for contact hole. Subsequently, through the openings the interlayer insulation film 18 and the $P^-$ well layer 4 are applied with etching in two steps to form collector contact holes reaching the surface of the $P^+$ buried layer 3, and then the thermally oxidized film as the resist is removed. Then, a first electrode region 20 comprising an Al film or an Al-Si film is formed according to the Al-CVD method (FIG. 4H).

10) Next, on the surface of the device region is formed a thermally oxidized film, which thermally oxidized film is applied with patterning to form resist openings for formation of contact holes for base and emitter. Next, through these openings, etching is applied on the interlayer insulation film 18 to form base contact holes and emitter contact holes, respectively. Subsequently, within these base contact holes and emitter contact holes, electrode layers 21 and 22 comprising an Al film or an Al-Si film are again formed so as to be coplanar with the interlayer insulation film 18 according to the Al-CVD method.

Figure 4H:
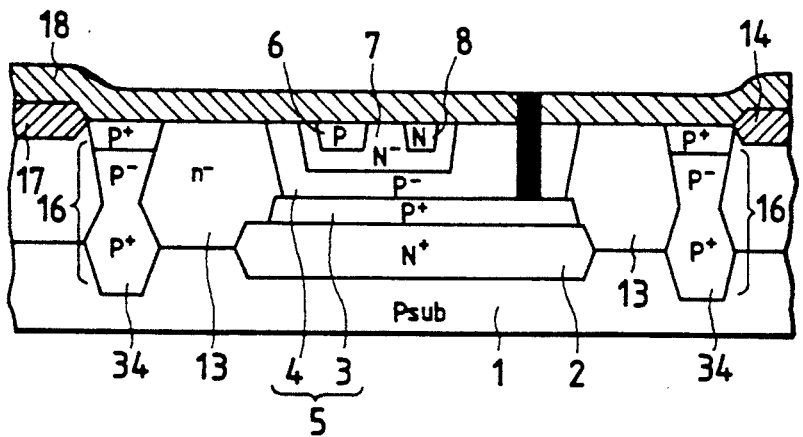
Figure 4I:
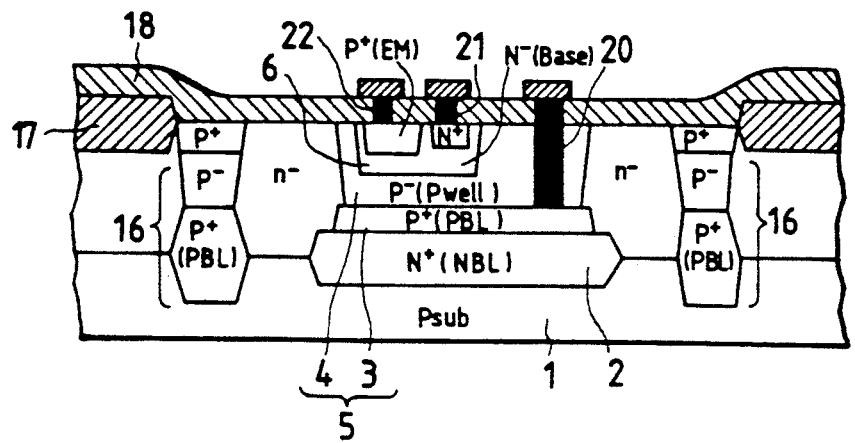

Next, an Al film or Al-Si film is formed with a thickness of 0.5 to 1.0 μm on the whole surface of the device region according of the non-selective CVD method or sputtering method, and by application of patterning to the Al film, etc., the respective electrodes of emitter electrode 10, base electrode 11, collector electrode 12 and the wirings accompanying these are formed to prepare the desired V-PNP (FIG. 4I).

As shown in FIG. 4H, the first electrode region 20 is grown so as to be coplanar with the interlayer insulation film 18 according to the Al-CVD method, but it is also possible to stop once the selective growth at the stage when the first wiring layer 20 has been grown to coplanar with the $P^+$ well layer 4, and effect selective growth by initiating again the Al-CVD method after formation of the base and emitter contact holes as described above, thereby making the respective upper surface of the first electrode region 20 and the electrode layers 21, 22 coplanar.

In a V-PNP transistor thus constituted, since the first electrode region 20 is provided, the collector series resistance of the $P^-$ well layer 4 can be reduced to a great extent, and therefore reduction of the emitter grounding current amplitude β of the large current region, namely the present transistor can be ameliorated.

(Second Embodiment)

Figure 5:
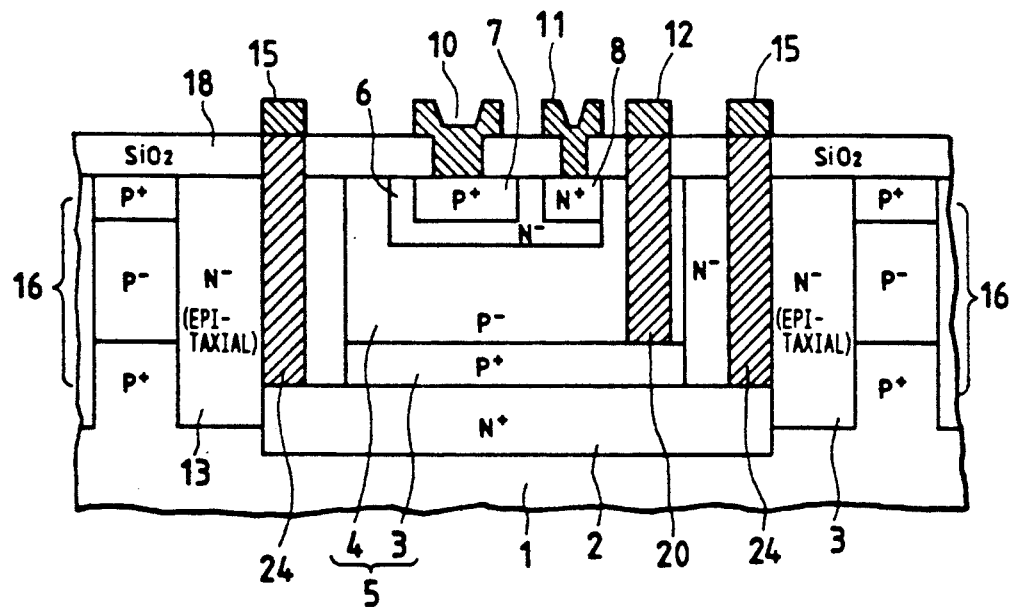
FIG. 5 is a schematic cross-sectional view showing the second embodiment of the present invention.

FIG. 5 is a schematic cross-sectional view showing another embodiment of the present invention. Also in FIG. 5, the same constituent portions as those of the V-PNP transistor of the prior art showing FIGS. 1, 2 are attached with the same reference numerals, and description thereof is omitted.

The present invention can be suitably used for the second wiring layer comprising an electroconductive material shown by the symbol 24 in FIG. 5. The second electrode region 24 connects the guard ring electrode 15 on the interlayer insulation film 17 to the $N^+$ buried layer 2, and is formed along the direction crossing at right angle to the surface of the P-type silicon substrate 1 so as to extend through the $N^-$ epitaxial layer 13 surrounding the collector region 5 and the interlayer insulation film 17.

As the electroconductive material forming the second electrode region 24, the same kind as that forming the first electrode material region 20 as described above can be used. And, when forming both of the electrode regions 20, 24, for example, after formation of necessary contact holes according to such steps as resist patterning, etching, etc., both electrode regions 20, 24 can be formed at the same time according to the Al-CVD method preferable for formation of the electrode regions according to the present invention.

In a V-PNP transistor thus constituted, since the second electrode region 24 is provided, even a parasitic PNP transistor may be constituted at the saturation step as the transistor actuation, the emitter grounding current amplification β of the parasitic PNP transistor can be reduced, and also the leak current to the P-type silicon substrate 1 reduced by biasing to the maximum potential. And, in the V-PNP transistor, as different from the structure of the V-PNP transistor of the prior art shown in FIG. 1, the second electrode region 24 is provided comprising Al, etc. instead of the deep N+ layer 14, and therefore no diffusion of the dopant from the N+ layer 14 is required to be considered. Hence, no great margin of the collector region 5 and the device separation region 16 is required to be taken, whereby the device size can be made smaller and also the junction capacity of the collector region 5 can be made smaller.

As described above, for formation of the first electrode region 20 or the second electrode region 24, other methods, for example, the sputtering method, the gas phase method such as the CVD method, etc. by use of triethylaluminum can be used, provided that such a deep hole can be buried. However, particularly with respect to the point that Al, films of good quality, etc. can be formed in the case when the aspect ratio (depth of hole/hole diameter) is relatively larger and the hole diameter itself is smaller as the contact hole for wiring layer as described above, the Al-CVD method as described below is preferred. According to the Al-CVD method, fine working can be suitably effected not only for an aspect ratio of 1.0 or higher as a matter of course, but also for 2.0 or higher, or 3.0 or higher.

Referring now to specific examples, the present invention is described in detail.

[Experimental example 1]

In the following manner, a V-PVP transistor with the constitution shown in FIG. 3 was prepared.

First, on the surface of a P-type silicon substrate having an impurity concentration of $10^{14}$ to $10^{15}/cm^3$ was formed a thermally oxidized film comprising $SiO_2$, etc. for diffusion mask with a thickness of 0.8 to 1.0 μm, and the thermally oxidized film was subjected to patterning to form openings with predetermined sizes, shapes on the thermally oxidized film. Subsequently, after introduction of an N-type impurity such as Sb (antimony) or As (arsenic) into the P-type silicon substrate through the openings 31 according to the ion injection method, heat treatment was effected to activate the N-type impurity simultaneously with diffusion internally of the P-type silicon substrate. Thus, an N+ buried layer of 40 to 120 Ω/□ was formed.

Next, after removal of the thermal fixed film as described, another thermal oxidized film comprising $SiO_2$, etc. was formed with a thickness of about 100 to 10000 Å. On the thermally fixed film was applied resist patterning. After introduction of a P-type impurity of B (boron) in the N+ buried layer and the region surrounding the outside of the N+ buried layer through the openings of the resist, heat treatment was applied after removal of the resist. By such heat treatment, the above-mentioned impurity was activated simultaneously with diffusion internally of the silicon substrate. Thus, a P+ layer of 200 to 1000 Ω/□ was formed.

As the next step, all of the oxidized films on the silicon substrate were removed, and then an N-type epitaxial layer was grown. The N-type epitaxial layer had a thickness of about 1 to 5 μm and a specific resistance of about 1 to 20 Ω/cm. By such epitaxial grown, a P+-type buried layer was formed on the N+ buried layer.

Next, on the surface of the N− epitaxial layer, a thermally oxidized film was formed, the thermally oxidized film was subjected to patterning to form openings, and after introduction of a P-type impurity such as B, etc. into the N− epitaxial layer surface with the thermally oxidized film as the mask through its openings according to the ion injection method, heat treatment was effected to have the impurity diffused internally of the N− epitaxial layer. By doing so, a P− well layer was formed on the P+ buried layer. The P− well layer had a sheet resistance of 2 to 10 kΩ/□.

Next, after removal of the thermally oxidized film from above the N− epitaxial layer, again a thermally oxidized film with a thickness of 100 to 10000 Å and a non-oxidizable film comprising $Si_3N_4$, etc. with a thickness of 1000 to 2000 Å were successively laminated. Then, the laminated film was applied with patterning to form openings for device separation region as described below. And, by the selective oxidation by use of the laminated film as oxidation resistant mask, the field insulation film region for device separation (thickness 0.8 to 1.0 μm) and the device region for bipolar transistor were formed, followed by removal of the laminated film.

Subsequently, on the surface of the N− epitaxial layer in the device region, a thermally oxidized film with a thickness of 200 to 10000 Å was again formed, which thermally oxidized film was applied with resist patterning to form openings for base formation of bipolar transistor. Then, after introduction of an N-type impurity through the openings according to the ion injection method, the thermally oxidized film as the resist was removed, following by heat treatment. By doing so, an N− well layer (base) was formed within the P− well layer. The base layer had a sheet resistance of about 0.6 to 3 kΩ/□.

Next, on the surface of the device region a thermally oxidized film was formed, and the thermally oxidized film was applied with resist patterning to form openings at the positions corresponding to the N− well layer (base), namely the emitter formation region and the PN device separation region. Then, after introduction of a P-type impurity such as B, $BF_2$, etc. through these openings according to the ion injection method, the thermally oxidized film as the resist was removed.

Subsequently, a thermally oxidized film was formed on the N− well layer (base), and the thermally oxidized film was applied with resist patterning to form openings for formation of the N+ layer for base contact. Then, after introduction of an N-type impurity such as As, etc., the thermally oxidized film as the resist was removed.

Then, the P-type and N-type impurities were activated, diffused by application of heat treatment to form the P+ layer and the N+ layer separate from each other on the upper part of the N well layer (base).

As the next step, after growth of BPSG, etc. on the whole surface of the device region and the device region to a thickness of 0.6 to 1.0 μm according to the CVD method, annealing was applied to form an interlayer insulation film.

Next, a thermally oxidized film was formed on the interlayer insulation film, and the thermally oxidized film was applied with resist patterning to form openings for collector contact hole. Subsequently, after formation of the interlayer insulation film and the P− well layer through the openings, etching was applied in two steps to form contact holes reaching the P+ buried layer surface, followed by removal of the thermally oxidized film as the resist. Next, within the collector contact holes, a first electrode region comprising an Al film was formed by use of DMAH and hydrogen while maintaining the substrate surface temperature at 270° C. The first electrode region was permitted to grow until its surface became coplanar with the interlayer insulation film surface.

Next, a thermally oxidized film was formed on the surface of the device region, and the thermally oxidized film was applied with patterning to form resist openings for formation of contact holes for base and emitter. Subsequently, through these openings, the interlayer insulation film was applied with etching to form base contact holes and emitter contact holes, respectively.

Then, within these base contact holes and emitter contact holes, respective electrode regions comprising Al film were formed according to the Al-CVD method.

Next, according to the sputtering method, an Al film was formed with a thickness of about 0.5 to 1.0 μm, and the Al film was applied with patterning to form a desired V-PNP transistor having the respective electrodes such as emitter electrode, base electrode, collector electrode, etc. and the wirings accompanied with these formed thereon.

In the V-PNP transistor thus prepared, reduction of the emitter grounding current amplification $\beta$ could be ameliorated.

[Second Experimental Example]

A V-PNP transistor with the constitution shown in FIG. 4 was prepared. The preparation steps are the same as those in the first Example as described above up to the steps before formation of the first electrode region according to the Al-CVD method.

In the present Example, the first electrode region and the second electrode region were formed at the same time according to the Al-CVD method.

In the V-PNP transistor thus prepared reduction of the emitter grounding current amplification $\beta$ could be ameliorated, and further the $\beta$ of the parasitic transistor could be reduced.

As described above, according to the present Example, the collector series resistance of the P$^-$ well layer of the collector region can be reduced to great extent by the first electrode region for connecting the surface electrode for collector and the P$^+$ buried region of the collector region, whereby reduction of the emitter grounding current amplification $\beta$ of the bipolar transistor can be ameliorated, and also the frequency characteristic can be improved.

Also, according to the present invention, in addition to the first electrode region as described above, by the second electrode region connecting the electrode for guard ring on the N$^-$ epitaxial layer and the N$^+$ buried layer, the $\beta$ of the parasitic transistor can be reduced, and also the leak current to the substrate can be reduced, even if the maximum potential may be biases without enlargement of the device size. Further, improvement of frequency characteristic can be effected, because the junction capacity of the collector region can be made smaller.

(Third Embodiment)

Next, the electrode structure according to the present invention is described by referring to an example in which it is applied to static induction transistor (SIT).

Figure 6:
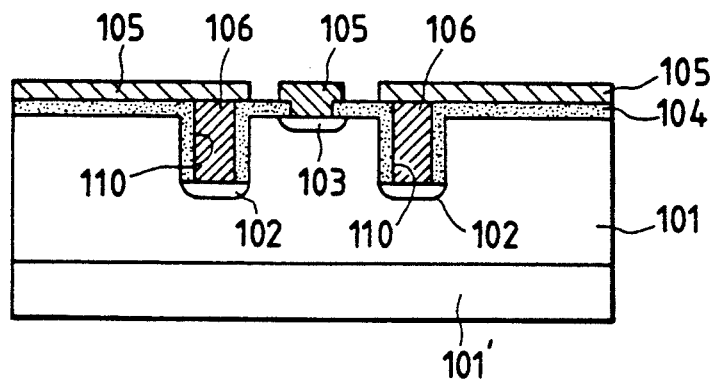
FIG. 6 is a schematic cross-sectional view showing the third embodiment of the present invention.

Referring now to drawings, an example of the present invention is described. In FIG. 6, 101 is a semiconductor substrate such as silicon, 101' a source region, 102 a gate diffusion region, 103 a drain diffusion region, 104 an insulation region such as silicon dioxide, 105 a metal wiring region formed by the sputtering method, etc., 106 an electrode region comprising aluminum or aluminum-silicon deposited within the concavity 110 by the selective aluminum CVD method.

FIGS. 7A to 7E are preparation steps of the SIT according to the present Example.

Figure 7A:
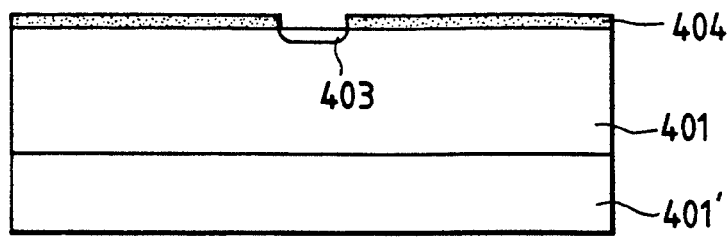
FIGS. 7A to 7E are schematic views for illustration of the semiconductor device according to the third embodiment of the present invention.

First, on the substrate 401' which becomes the source region, a silicon dioxide film 404 is grown to 4000 Å according to the thermal oxidation method on the silicon substrate 401 provided with an epitaxial layer with high resistance. Next, at predetermined positions of the oxidized film 404, holes are opened for the drain region of 1 μm square. Next, by way of ion injection, arsenic is implanted at $1 \times 10^{16}$ ions/cm$^2$, to form a drain diffusion layer 403 (FIG. 7A).

Figure 7B:
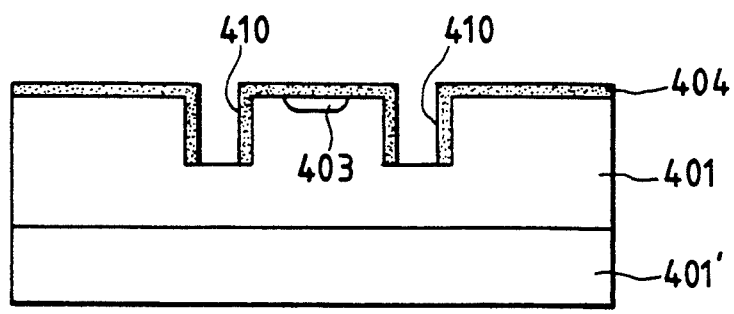

Next, according to the lithographic steps, for example, a resist image with holes of about 0.8 μm in width being opened is formed according to the lithographic steps. With that resist as the mask, the oxidized film 404 was subjected to hole opening by dry etching by use of an etchant of the C$_2$F$_6$-CHF$_3$ system, and then a concavity 410 with a depth of, for example, about 1.0 μm is formed by dry etching of the CCl$_2$F$_2$-N$_2$ system on the substrate 401. Then, the resist used for the mask was removed, and a silicon dioxide film with a thickness of 1500 Å is permitted to grow on the side and the bottom surfaces of the concavity 410. At this time, also the exposed portion of the drain surface is covered at the same time with silicon dioxide, and then reactive ion ethcing with the C$_2$F$_6$-CHF$_3$ is effected to have only the bottom surface of the concavity 410 exposed (FIG. 7B).

Figure 7C:
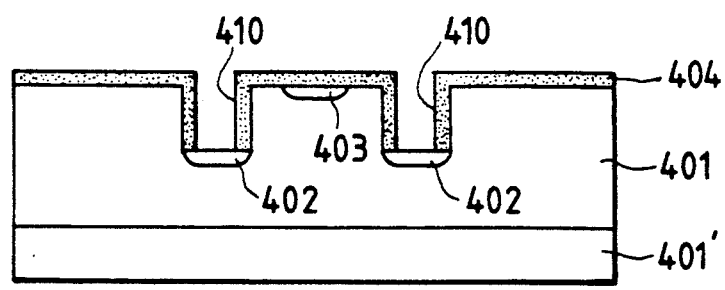
Figure 7D:
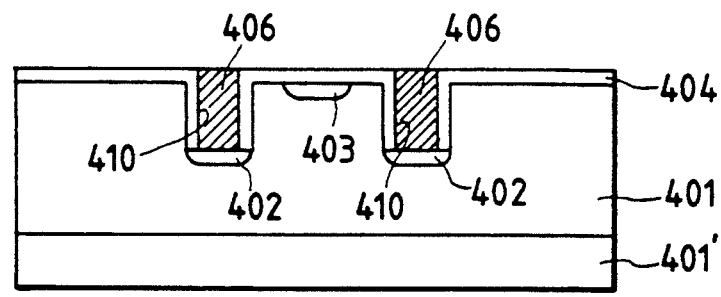
Figure 7E:
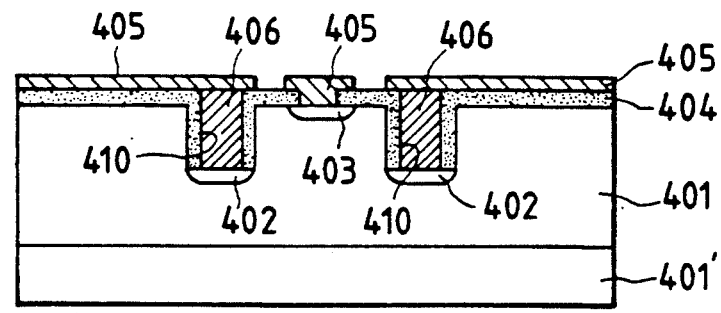

Next, by ion injection, boron trifluoride is implanted at a density of $1 \times 10^{15}$ ions/cm$^2$. Subsequently, ion activation is effected in a nitrogen atmosphere of about 1000° C., 10 minutes to form a gate diffusion layer 402 (FIG. 7C).

Figure 8:
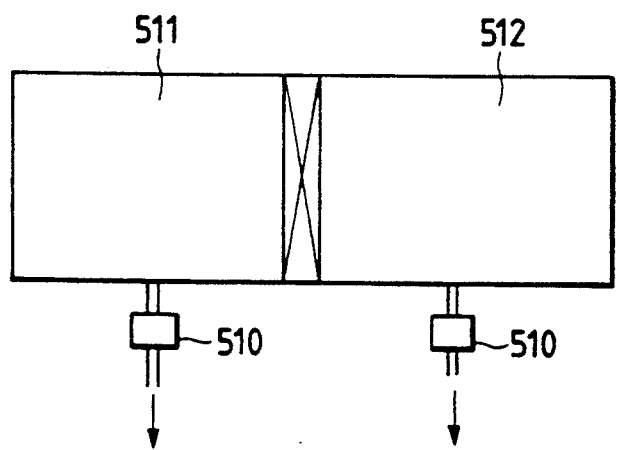
FIG. 8 is a schematic view for illustration of the CVD apparatus to be used for preparation of the semiconductor device according to the present invention.

Next, burying within the concavity of the aluminum-silicon which is the specific feature of the present invention is practiced. For the substrate with the structure shown in FIG. 7C, the treatment for burying the aluminum-silicon is described in detail by referring to FIG. 8.

First, a substrate is arranged in the loadlock chamber 511. Into the loadlock chamber 511 is introduced hydrogn as described above to form a hydrogen atmosphere. And, the reaction chamber 512 is evacuated internally to ca. $1 \times 10^{-8}$ Torr by the evacuation system 510.

However, an Al-Si film can be formed even if the vacuum degree within the reaction chamber 512 may be poorer than $1 \times 10^{-8}$ Torr.

And, from the gasline not shown, dimethylaluminum hydride (DMAH) and Si$_2$H$_6$ are fed. For the carrier gas through the DMAH line, H$_2$ is employed.

The second gasline not shown in for H$_2$ as the reaction gas, and H$_2$ is permitted to flow through the second gasline, and the opening of the slow leak value not shown was controlled to adjust the pressure within the reaction chamber 512 to a predetermined value. A typical pressure in this case is made ca. 1.5 Torr. Through the DMAH line, DMAH is introduced into the reaction tube. The total pressure is ca. 1.5 Torr, and the DMAH partial pressure is made ca. $1.5 \times 10^{-4}$ Torr, and the Si$_2$H$_6$ partial pressure $2 \times 10^{-6}$ Torr. Then, the lamp is lighted to heat directly the wafer. Thus, an Al-Si is deposited.

As the starting gas containing Si as the second starting gas during formation of the Al-Si flim, $Si_2H_6$, $SiH_4$, $Si_3H_8$, $Si(CH_3)_4$, $SiCl_4$, $SiH_2Cl_2$, $SiH_3Cl$ can be employed.

By addition of DMAH, $H_2$ and Si starting gas such as $Si_2H_6$, etc., an Al-Si containing 0.5 to 2.0% of Si can be deposited. The reaction tube pressure may be 0.05 to 760 Torr, desirably 0.1 to 0.8 Torr, the substrate temperature 260° C. to 440° C., the DMAH partial pressure $1 \times 10^{-5}$-fold to $1.3 \times 10^{-3}$-fold of the pressure within the reaction tube, the $Si_2H_6$ pressure in the range of $1 \times 10^{-7}$ to $1 \times 10^{-4}$-fold of the pressure within the reaction tube, whereby an Al-Si can be thus deposited.

After elapse of a predetermined deposition time, feeding of DMAH is once stopped. The predetermined deposition time for the Al-Si film deposited in the process refers to the time before the Al-Si buries the concavity 410 therein, which is about 20 minutes. The substrate of the substrate temperature by direct heating at this time is made 270° C. During the steps up to this step, an Al-Si film 406 is deposited selectively only at the concavity portion 410 (see FIG. 7D).

Next, on the drain region 403, holes are opened according to lithographic steps, and an aluminum-silicon 405 is deposited to 8000 Å on the whole substrate surface by the DC sputtering method. Finally, dry etching according to the $Cl_2BCl_3$-He system is applied to work the aluminum-silicon to a desired wiring shape (see FIG. 7E).

In the Example as described above, description is made about the case of N channel SIT wherein the drain electrode 103 is n-type and the gate electrode 102 is the p-type N channel SIT, but P-channel wherein the drain electrode 103 is p-type and the gate electrode 102 is n-type can be also similarly formed.

As described above, by use of the selective aluminum CVD method, a buried electrode region of the improved type SIT with a width of the concavity of 0.8 μm or less can be formed with high reliability.

The film forming method preferable for the present invention is to form a deposited film by the surface reaction on an electron-donative substrate by use of a gas of an alkylaluminum hydride and hydrogen gas (hereinafter called the Al-VCD method).

Particularly, by use of monomethylaluminum hydride (MMAH) as the starting gas or dimethylaluminum hydride (DMAH) as the starting gas, and $H_2$ gas as the reactive gas, and heating the substrate surface under the mixture of these gases, an Al film of good quality can be deposited. Here, during the selective deposition of Al, it is preferable to maintain the surface temperature at the decomposition temperature of the alkylaluminum hydride or higher and less than 450° C., more preferably 260° C. to 440° C.

As the method for heating the substrate to the abovementioned temperature range, there are direct heating and indirect heating. Particularly, by maintaining the substrate at the above-mentioned temperature by direct heating, an Al film of good quality can be formed at high deposition speed. For example, when the substrate surface temperature during Al film formation is made 260° C. to 440° C. which is more preferable temperature range, a film of good quality can be obtained at higher deposition speed of 300 Å to 5000 Å/min. which is higher than in the case of resistance heating. As such direct heating method (substrate itself is heated by direct transmission of the energy from the heating means to the substrate), for example, lamp heating by means of halogen lamp, xenon lamp, etc. may be included. As the method for indirect heating, there is resistance heating, by which heating can be performed by use of a heat-generating body, etc. provided at the substrate supporting member for supporting the substrate to form deposited film arranged in the space for formation of the deposited film.

By applying the CVD method to the substrate having the electron-donative surface portion and the non-electron donative surface portion co-present thereon, a single crystal of Al is formed under good selectivity only on the electron-donative substrate surface portion. The Al thus formed will have all of excellent characteristics desirable for the electrode/wiring material. That is, reduction of generation probability of hillock, reduction of generation probability of alloy spike will be accomplished.

This may be considered to be due to the fact that substantially no or extremely small formation of alloy spike, etc. on account of the eutectic reaction with the subbing silicon, etc. is seen, because Al of good quality can be formed on the surface comprising a semiconductor or an electroconductive member as the electron-donative surface, and also the Al is excellent in crystallinity. And, when employed for the electrode of a semiconductor device, an effect surpassing the concept of the Al electrode which has been contemplated in the prior art, and could not be even expected in the prior art can be obtained.

Having described above about the fact that the Al deposited on an electron-donative surface, for example, within the opening with the semiconductor substrate surface exposed becomes to have a single crystalline structure, according to the Al-CVD method, a metal film composed mainly of Al as described below can be also selectively deposited, and its film quantity also exhibits excellent characteristics.

For example, in addition to a gas of an alkylaluminum hydride and hydrogen, a gas containing Si atoms such as $SiH_4$, $Si_2H_6$, $Si_3H_8$, $Si(CH_3)_4$, $SiCl_4$, $SiH_2Cl_2$, $SiHCl_3$, or the like, a gas containing Ti atoms such as $TiCl_4$, $TiBr_4$, $Ti(CH_3)_4$, etc., a gas containing Cu atoms such as copper bisacetylacetonate $Cu(C_5H_7O_2)$, copper bisdipivaloylmethanite $Cu(C_{11}H_{19}O_2)_2$, copper bishexafluoroacetylacetonate $Cu(C_5HF_6O_2)_2$, etc., may be introduced in a preferable combination to form a gas mixture atmosphere, thereby forming an electrode by selective deposition of an electroconductive material such as Al-Si, Al-Ti, Al-Cu, Al-Si-Ti, Al-Si-Cu, etc.

The Al-CVD method as described above is a film forming method excellent in selectivity, and also the surface characteristic of the film formed has good surface characteristic. Hence, by application of a non-selective film forming method to the next deposition step, Al or a metal film composed mainly of Al can be also formed on the Al film selectively deposited as described above and $SiO_2$, etc. as the insulating film, whereby a preferable metal film having high useability for general purpose as the wiring of semiconductor device can be obtained.

Specific examples of such metal film include the following. There may be included combinations of Al, Al-Si, Al-Ti, Al-Cu, Al-Si-Ti, Al-Si-Cu, etc. deposited selectively with Al, Al-Si, Al-Ti, Al-Cu, Al-Si-Ti, Al-Si-Cu, etc.

As the film forming method for non-selective deposition, there are other CVD methods than the Al-CVD method as described above, the sputtering method, etc.

(Film forming Apparatus)

Next, a preferable film forming apparatus for forming the electrode according to the present invention is described.

Figure 9:
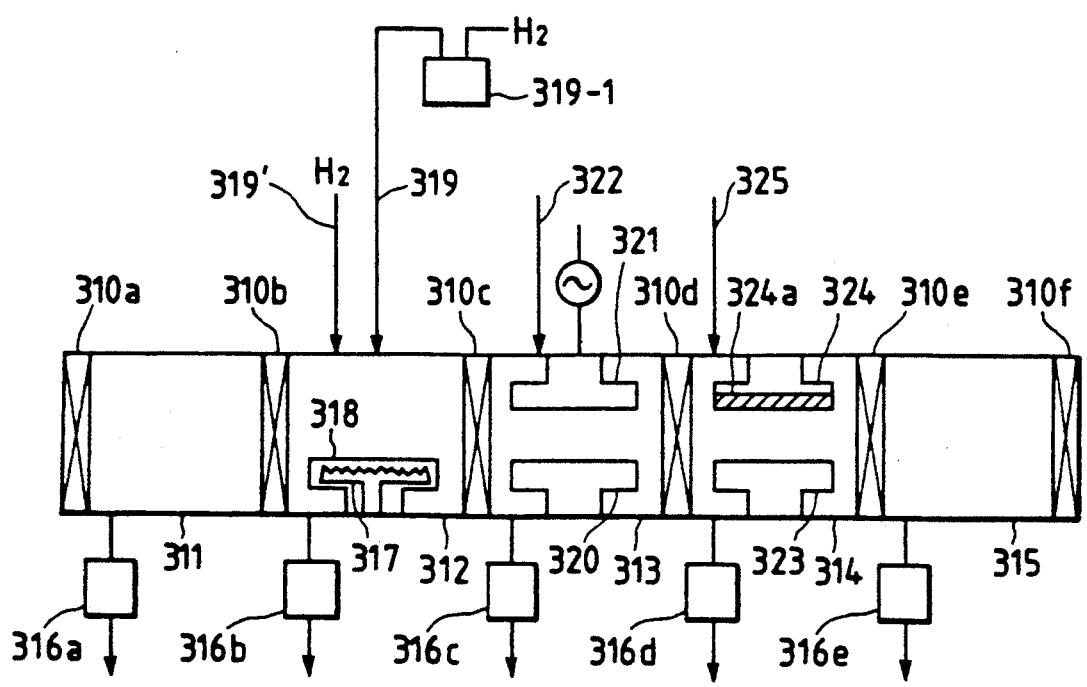
FIGS. 9, 10 are schematic views showing one example of the film forming apparatus to be used for practicing the preferable film forming method of the wiring layer in the semiconductor device according to the present invention.
Figure 10:
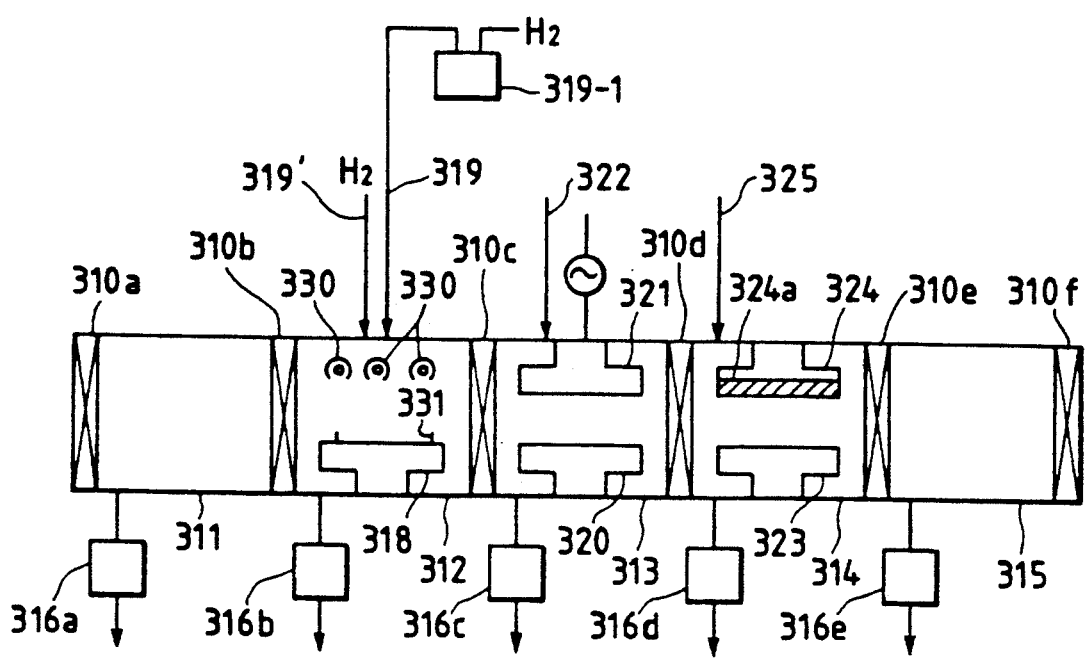
Figure 11:
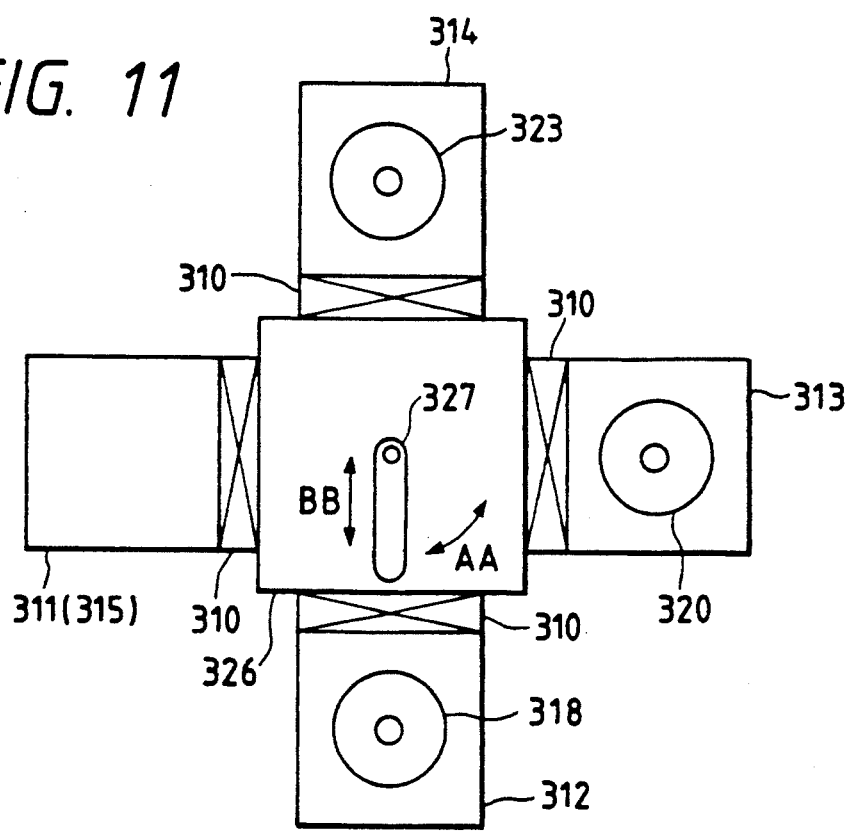
FIG. 11 is a schematic plan constitutional view of the apparatus shown in FIGS. 9 and 10.

FIG. 9 to FIG. 11 show schematically a sequential metal film forming apparatus preferable for applying the film forming method as described above.

The sequential metal film forming apparatus, as shown in FIG. 9, is constituted of loadlock chamber 311 connected mutually communicated under shielding from outer air through the gate valves 310a to 310f, a CVD reaction chamber 312 as the first film forming chamber, an Rf etching chamber 313, a sputtering chamber 14 as the second film forming chamber and a loadlock chamber 315, and the respective chambers are constituted reducible in pressure by evacuation with the evacuation systems 316a to 316e. Here, the above loadlock chamber 311 is a chamber for replacing the substrate atmosphere before deposition treatment with $H_2$ atmosphere after evacuation in order to improve the throughput characteristic. The next CVD reaction chamber 312 is a chamber for selective deposition on the substrate according to the Al-CVD method as described above under normal pressure or reduced pressure, in which a substrate holder 318 having a heat-generating member 317 which can heat the substrate to be formed to a range of 200° C. to 450° C. is provided internally, and starting gases such as alkylaluminum hydride bubbled and gasified in the bubbler 319-1 are introduced into the chamber through the starting gas introducing line 319 for CVD, and also hydrogen gas as the reactive gas is introduced through the gasline 319'. The next Rf etching chamber 313 is a chamber for carrying out cleaning of the substrate surface after selective deposition (etching) under Ar atmosphere, and internally thereof are provided at least a substrate holder 320 capable of heating the substrate to a range of 100° C. to 250° C. and an electrode line for Rf etching 321, and also an Ar gas feeding line 322 is connected. The next sputtering chamber 314 is a chamber for depositing non-selectively a metal film by sputtering under Ar atmosphere on the substrate surface, and internally thereof are provided a substrate holder 323 heated within a range of 200° C. to 250° C. and a target electrode 324 for mounting a sputter target material 324a, and also an Ar gas feeding line 325 is connected. The final loadlock chamber 315 is a control chamber before taking out the substrate after completion of the metal film deposition into the outer air, and constituted so that the atmosphere may be replaced with $N_2$.

FIG. 10 shows another constitutional example of a sequential metal film forming apparatus preferable for applying the film forming method as described above, and the same portions as described above in FIG. 9 are made the same symbols. The difference of the apparatus in FIG. 10 from that in FIG. 9 resides in that a halogen lamp 330 is provided as the direct heating means and the substrate surface can be directly heated, and for that purpose, the substrate holder 312 is provided with a nail 331 for holding the substrate under suspended state.

By heating directly the substrate surface with such constitution, the deposition speed can be further improved as described above.

Figure 12:
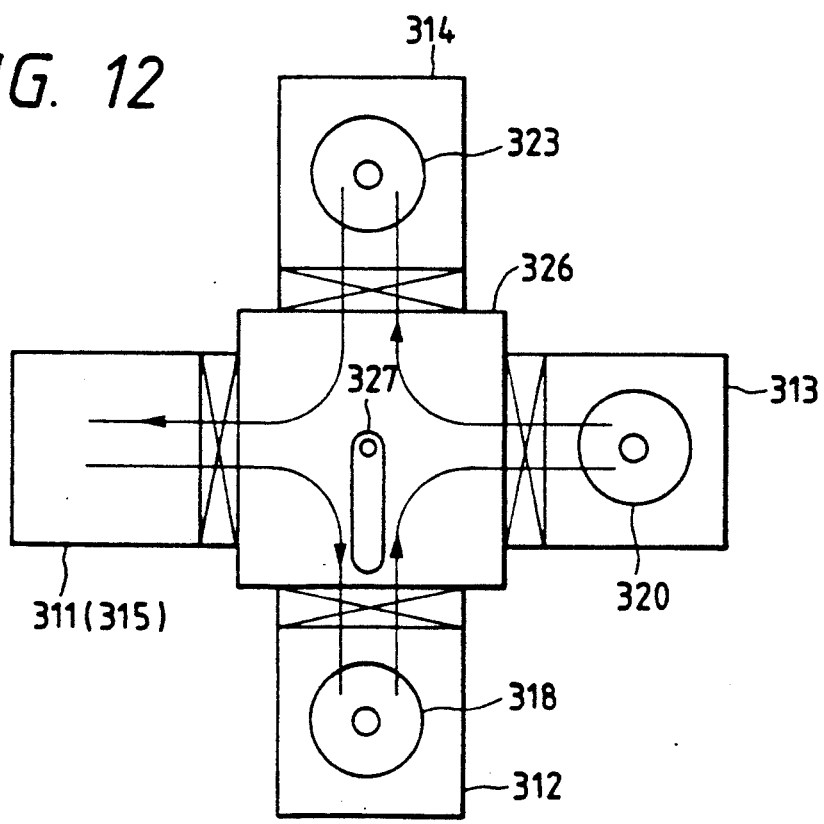
FIG. 12 is a schematic constitutional view of the movement order of the substrate in FIG. 11 added with arrowheads.

The sequential metal film forming apparatus with the above constitution, as shown in FIG. 11, is substantially equivalent to one with the structure having the above loadlock chamber 311, the CVD reaction chamber 312, the Rf etching chamber 313, the sputtering chamber 314, the loadlock chamber 315 connected mutually to one another with the conveying chamber 326 as the relay chamber. With this constitution, the loadlock chamber 311 functions also as the loadlock chamber 315. In the above conveying chamber 326, as shown in the figure, an arm 327 as the conveying means reversibly rotatable in the AA direction and stretchable in the BB direction is provided, and with the arm 327, as shown in the arrowhead in FIG. 12, the substrate can be moved following the steps successively from the loadlock chamber 311 to the CVD chamber 312, the Rf etching chamber 313, the sputtering chamber 314, the loadlock chamber 315 without exposure to outer air.

(Film Forming Procedure)

The film forming procedure for forming the electrode and wiring according to the present invention is described.

FIG. 13 is a schematic perspective view for illustration of the film forming procedure for formation of the electrode and wiring according to the present invention.

First, the outline is described. A semiconductor substrate having openings formed on an insulating film is prepared, which substrate is arranged in a film forming chamber, and its surface is maintained at, for example, 260° C. to 450° C. to deposit selectively Al at the portion where the semiconductor is exposed according to the hot CVD method in a mixed atmosphere of DMAH as the alkylaluminum hydride and hydrogen gas. Of course, as described above, a metal film composed mainly of Al such as Al-Si, etc. may be also deposited selectively by introducing a gas containing Si atoms, etc. Next, on the Al selectively deposited by the sputtering method and the insulating film, Al or a metal film composed mainly of Al is non-selectively formed. Then, by patterning of the metal film non-selectively deposited to a desired wiring shape, electrodes and wirings can be formed.

Referring next to FIG. 10 and FIG. 13, description is made in more detail. First, a substrate is prepared. As the substrate, for example, a single crystalline Si wafer having an insulating film provided with openings with respective apertures provided thereon is prepared.

Figure 13A:
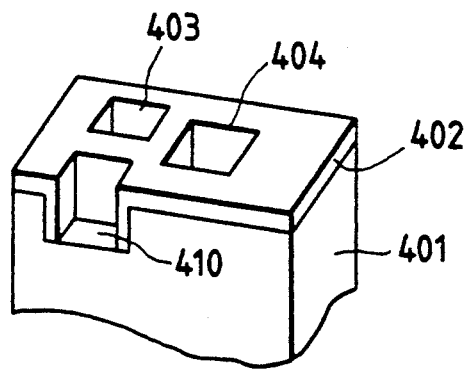
FIGS. 13A to 13D are schematic views for illustration of the preferable film forming method for formation of the wiring layer in the semiconductor device according to the present invention.

FIG. 13A is a schematic view showing a part of the substrate. Here, 401 is a single crystalline silicon substrate as a conductive substrate, 402 a thermally oxidized silicon film as the insulating film (layer). 403 and 404 are openings (exposed portions), having apertures different from each other. 410 is the groove bottom with Si exposed.

The procedure for forming Al film which becomes the electrode as the first wiring layer on the substrate is as follows with FIG. 10.

First, the substrate as described above is arranged in the loadlock chamber 311. Hydrogen is introduced into the loadlock chamber 311 to make it under hydrogen atmosphere. And, the reaction chamber 312 is internally evacuated to approximately $1 \times 10^{-8}$ Torr by the evacuation system 316b. However, Al film can be formed even if the vacuum degree within the reaction chamber 312 may be worse than $1 \times 10^{-8}$ Torr.

And, the gas of DMAH bubbled from the gasline 319 is fed. For the carrier gas for the DMAH line, $H_2$ is employed.

The second gasline 319' is for $H_2$ as the reaction gas, and by flowing $H_2$ through the second gas line 319' and controlling the opening degree of the slow leak valve not shown to adjust the pressure within the reaction chamber 312 to a predetermined value. A typical pressure in this case is preferably about 1.5 Torr. Through the DMAH line, DMAH is introduced into the reaction tube. The total pressure is made about 1.5 Torr, and the DMAH pressure $5.0 \times 10^{-3}$ Torr. Then, current is passed to the halogen lamp 330 to heat directly the wafer. Thus, Al is selectively deposited.

After elapse of a predetermined deposition time, feeding of DMAH is once stopped. The predetermined deposition time of the Al film deposited in this process is the time until the thickness of the Al film on the Si (single crystalline silicon substrate 1) becomes equal to the film thickness of the $SiO_2$ (thermally oxidized silicon film 2), and can be determined previously by experimentation.

Figure 13B:
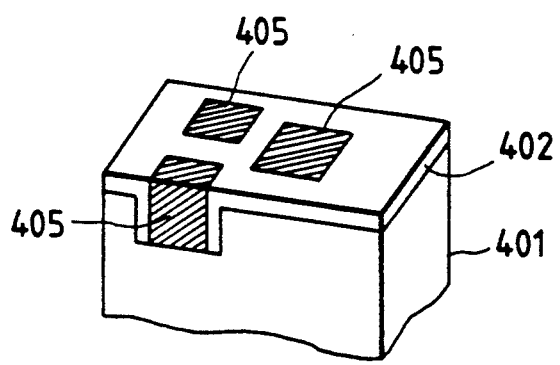

The temperature of the substrate surface by direct heating at this time is made about 270° C. According to the steps up to this state, the Al film 405 is selectively deposited within the openings and the grooves as shown in FIG. 13B.

All of the steps as described above are referred to as the first film forming step for formation of electrode within contact hole.

After the above first film forming step, the CVD reaction chamber 312 is evacuated until reaching a vacuum degree of $5 \times 10^{-3}$ Torr or lower by the evacuation system 316b. At the same time, the Rf etching chamber 313 is evacuated to $5 \times 10^{-6}$ Torr or lower. After confirmation that the both chambers have reached the above vacuum degree, the gate valve 310c is opened, the substrate moved from the CVD reaction chamber 312 to the Rf etching chamber 313 by the conveying means, and the gate valve 310c closed. The substrate is conveyed to the Rf etching chamber 313, and the Rf etching chamber 313 is evacuated by means of the evacuation system 316c until reaching a vacuum degree of $10^{-6}$ Torr or lower. Then, argon is fed through the argon feeding line 322 for Rf etching, and the Rf etching chamber 313 maintained under an argon atmosphere of $10^{-1}$ to $10^{-3}$ Torr. The substrate holder 320 of Rf etching is maintained at about 200° C., Rf power of 100 W supplied to the electrode for Rf etching 321 for about 60 seconds, and discharging of argon is caused to occur within the Rf etching chamber 313 for about 60 seconds. By doing so, the surface of the substrate can be etched with argon ions to remove unnecessary surface layer of the CVD deposited film. The etching depth in this case is made about 100 Å in terms of the oxide. Here, surface etching of the CVD deposited film is effected in the Rf etching chamber, but since the surface layer of the CVD film of the substrate conveyed through vacuum contains no oxygen, etc., no Rf etching may be effected. In that case, the Rf etching chamber 313 function as the temperature changing chamber for effecting temperature change within a short time, when the temperatures in the CVD reaction chamber 12 and the sputtering chamber 314 are greatly different.

In the RF etching chamber 313, after completion of Rf etching, flowing of argon is stopped, and the argon within the Rf etching chamber 313 is evacuated. After the Rf etching chamber 313 is evacuated to $5 \times 10^{-6}$ Torr and the sputtering chamber 314 to $5 \times 10^{-6}$ Torr or lower, the gate valve 310d is opened. Then, the substrate is moved from the Rf etching chamber 313 to the sputtering chamber 314 by means of a conveying means, followed by closing of the gate valve 310d.

After the substrate is conveyed to the sputtering chamber 314, the sputtering chamber 314 is made under an argon atmosphere of $10^{-1}$ to $10^{-3}$ Torr similarly as in the Rf etching chamber 313, and the temperature of the substrate holder 323 for mounting the substrate set to about 200° to 250° C. And discharging of argon is effected at a DC power of 5 to 10 kw to cut a target material such as Al or Al-Si (Si: 0.5%) and effect film formation of a metal 10000 Å/min. on the substrate. This step is a non-selective deposition step. This is called the second film forming step for formation of the wiring to be connected to the electrode.

After formation of a metal film of about 5000 Å, flowing of argon and application of DC power are stopped. After evacuation of the loadlock chamber 311 to $5 \times 10^{-3}$ Torr or lower, the gate valve 310e is opened and the substrate moved. After the gate valve 310e is closed, $N_2$ gas is permitted to flow into the loadlock chamber 311 until reaching atmospheric pressure, the gate valve 310f opened and the substrate taken out of the apparatus.

Figure 13C:
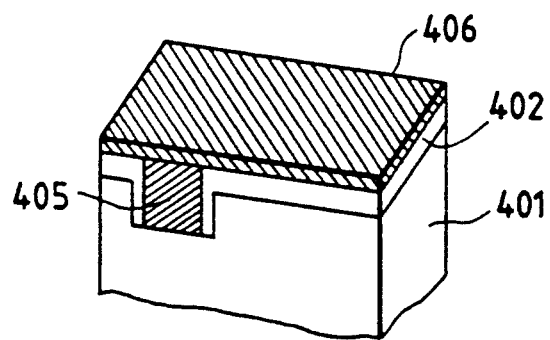

According to the second Al film deposition step as described above, the Al film 406 can be formed on the $SiO_2$ film 402 as shown in FIG. 13C.

Figure 13D:
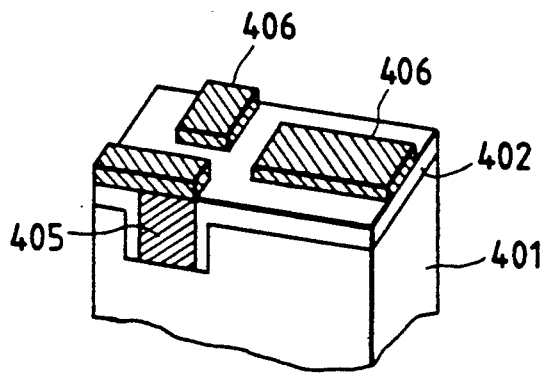

And, by patterning the Al film 406 as shown in FIG. 13D, a wiring with a desired shape can be obtained.

(Experimental Examples)

In the following, how excellent is the above-described Al-CVD method is and how good of the quality the Al film deposited within the openings is are described based on the experimental results.

First, as the substrate, a plurality of N-type single crystalline silicon wafers were prepared, which are thermally oxidized on the surface to form $SiO_2$ of 8000 Å, and have various openings with various apertures from 0.25 μm c 0.25 μm square to 100 μm × 100 μm square patterned to have the subbing Si single crystal exposed (Sample 1-1).

These are subjected to formation of Al films according to the Al-CVD method under the conditions as described below. Under the common conditions by use of DMAH as the starting gas, and hydrogen as the reaction gas, a total pressure cf 1.5 Torr, a DMAH partial pressure of $5.0 \times 10^{-3}$ Torr, the power amount passed through the halogen lamp is adjusted and the substrate surface temperature set within the range of 200° C. to 490° C. to form films.

The results are shown in Table 1.

TABLE 1

| Substrate surface temperature (°C.) | 200 | 230 | 250 | 260 | 270 | 280 | 300 | 350 | 400 | 440 | 450 | 460 | 470 | 480 | 490 |
|---|---|---|---|---|---|---|---|---|---|---|---|---|---|---|---|
| Deposition speed (Å/min) | ← | 1000~1500 | → | ← | ← | ← | ← | ← | ← | ← | ← | 3000~5000 | → | → | → |
| Line defect of Si | ← | ← | ← | ← | ← | ← | ← | ← | Not recognized | → | → | → | → | → | → |

TABLE 1-continued

| Substrate surface temperature (°C.) | 200 | 230 | 250 | 260 | 270 | 280 | 300 | 350 | 400 | 440 | 450 | 460 | 470 | 480 | 490 |
|---|---|---|---|---|---|---|---|---|---|---|---|---|---|---|---|
| Carbon content | ← | ← | ← | ← | ← | ← | ← | Not detected | → | → | → | → | → | → | → |
| Resistance ($\mu\Omega$cm) | ← | 2.7~3.3 | → | ← | ← | ← | ← | 2.8~3.4 | → | → | → | → | → | → | → |
| Reflectance (%) | ← | ← | 85~95 | → | → | ← | ← | 90~95 | → | → | ← | ← | ~60 | → | → |
| Hillock density of 1 $\mu$m or larger (cm$^{-2}$) | ← | 1~10$^2$ | → | ← | ← | ← | 0~10 | → | → | → | ← | ← | 10~10$^4$ | → | → |
| Spike generation (%) (destruction probability of 0.15 $\mu$m junction) | ← | ← | ← | ← | ← | ← | 0 | → | → | → | ← | ← | 0~30 | → | → |

As can be seen from Table 1, at a substrate surface temperature by direct heating of 260° C. or higher, Al is deposited selectively at a high deposition speed of 3000 to 5000 Å/min. within the openings.

When the characteristics of the Al film within the openings at substrate surface temperature range of 260° C. to 440° C. are examined, they are found to be excellent such that no carbon is contained, with resistivity being 2.8 to 3.4 $\mu\Omega$cm, reflectance 90 to 95%, hillock density of 1 $\mu$m or higher 0 to 10 and substantially no spike generation (destruction probability of 0.15 $\mu$m junction).

In contrast, at substrate surface temperatures of 200° C. to 250° C., the film is found to be considerably good as compared with the prior art although the film quality is slightly worse as compared with the case of 260° C. to 440° C., but the deposition speed is 1000 to 1500 Å/min., which can never be said to be sufficiently high.

When the substrate surface temperature becomes 450° C. or higher, the characteristics of the Al film with the openings are lowered with the reflectance becoming 60% or less, hillock density of 1 $\mu$m or more 10 to 10$^4$ cm$^{-2}$, alloy spike generation 0 to 30%.

Next, description is made about how suitably the method as described above can be used openings such as contact hole or thru-hole.

That is, it can be also preferably applied to the contact hole/thru-hole structure comprising the material as described below.

On the sample 1-1 as described above, an Al film is formed on a substrate (sample) as described below under the same conditions as when the Al film is formed.

On a single crystalline silicon as the first substrate surface material is formed a silicon oxide film according to the CVD method as the second substrate surface material, and patterning effected according to the photolithographic steps to have the single crystalline silicon surface partially exposed.

The film thickness of the thermally oxidized SiO$_2$ film has a film thickness of 8000 Å, the exposed portion of the single crystalline silicon a size of 0.25 $\mu$m × 0.25 $\mu$m to 100 $\mu$m × 100 $\mu$m. Thus, sample 1-2 is prepared (hereinafter such samples are represented as "CVD SiO$_2$ (hereinafter abbreviated as SiO$_2$/single crystalline silicon").

Sample 1-3 is boron doped oxide film formed by normal pressure CVD (hereinafter abbreviated as BSG)/single crystalline silicon, sample 1-4 phosphorus doped oxide film formed by normal pressure CVD (hereinafter abbreviated as PSG)/single crystalline silicon, sample 1-5 phosphorus and boron doped oxide film formed by normal pressure CVD (hereinafter abbreviated as BSPG)/single crystalline silicon, sample 1-6 nitride film formed by plasma CVD (hereinafter abbreviates as P-SiN)/single crystalline silicon, sample 1-7 hot nitride film (hereinafter abbreviated as T-SiN)/single crystalline silicon, sample 1-8 nitride film formed by low pressure CVD (hereinafter abbreviated as LP-SiN)/single crystalline silicon, sample 1-9 nitride film formed by means of an ECR apparatus (hereinafter abbreviated as ECR-SiN)/single crystalline silicon.

Further, according to all combinations of the first substrate surface materials (18 kinds) and the second substrate surface materials (9 kinds), samples 1-11 to 1-179 (note: sample Nos. 1-10, 20, 30, 40, 50, 60, 70, 80, 90, 100, 110, 120, 130, 140, 150, 160, 170 are lacking) are prepared. As the first substrate surface material, single crystalline silicon (single crystalline Si), polycrystalline silicon (polycrystalline Si), amorphous silicon (amorphous Si), tungsten (W), molybdenum (Mo), tantalum (Ta), tungsten silicide (WSi), titanium silicide (TiSi), aluminum (Al), aluminum silicon (Al-si), titanium aluminum (Al-Ti), titanium nitride (Ti-N), copper (Cu), aluminum silicon copper (Al-Si-Cu), aluminum palladium (Al-Pd), titanium (Ti), molybdenum silicide (Mo-Si), tantalum silicide (Ta-Si) are employed. As the second substrate surface material, T-SiO$_2$, SiO$_2$, BSG, PSG, BPSG, P-SiN, T-SiN, LP-SiN, ECR-SiN are employed. For all of the samples as described above, good Al films comparable with the sample 1-1 could be formed.

Next, on the substrate having Al deposited selectively as described above, Al is deposited non-selectively according to the sputtering method as described above, followed by patterning.

As the result, the Al film formed according to the sputtering method, and the Al film selectively selected within the openings are found to be under the contact state with both electrically and mechanically high durability due to good surface characteristic of the Al film.

We claim:

1. An electrostatic induction transistor comprising:
 a first semiconductor region of a first conductivity type;
 a second semiconductor region of said first conductivity type having higher resistance than said first semiconductor region and being disposed over said first semiconductor region;
 an electrode disposed on a surface of said second semiconductor region; and
 a metallic region disposed within said second semiconductor region so as to form a gate electrode by connecting a third semiconductor region of a second conductivity type buried in said second semiconductor region and said electrode through said second semiconductor region,
 wherein said metallic region is formed of single-crystalline aluminum.

* * * * *

UNITED STATES PATENT AND TRADEMARK OFFICE
CERTIFICATE OF CORRECTION

PATENT NO. : 5,306,934

DATED : April 26, 1994

INVENTOR(S) : YUZO KATAOKA, ET AL.

It is certified that error appears in the above-identified patent and that said Letters Patent is hereby corrected as shown below:

COLUMN 1

Line 14, "is with" should read --is used with--.

COLUMN 2

Line 24, "than" should read --that--.
    Line 66, "FIGS. 9, 10" should read --FIGS. 9 and 10--.

COLUMN 3

Line 34, "symbols" should read --reference numerals--.
    Line 37, "symbol 20" should read --reference numeral 20--.

COLUMN 4

Line 19, "sizes," should read --sizes and--.

COLUMN 5

Line 19, "a" should read --an--.

COLUMN 6

Line 13, "according of" should read --according to--.
    Line 35, "transistor" should read --transistor,--.
    Line 42, "showing" should read --shown in--.

COLUMN 7

Line 53, "resist" should read --a resist--.
    Line 67, "grown," should read --growth,--.

UNITED STATES PATENT AND TRADEMARK OFFICE
CERTIFICATE OF CORRECTION

PATENT NO. : 5,306,934  Page 2 of 3
DATED : April 26, 1994
INVENTOR(S) : YUZO KATAOKA, ET AL.

It is certified that error appears in the above-identified patent and that said Letters Patent is hereby corrected as shown below:

COLUMN 8

Line 56, "N well" should read --$N^-$ well--.

COLUMN 10

Line 1, "drawings," should read --the drawings,--.
Line 35, "ethcing" should read --etching--.
Line 49, "drogn" should read --drogen--.
Line 59, "in" should read --is--.
Line 61, "value" should read --valve--.

COLUMN 11

Line 13, "pressure" should read --partial pressure--.
Lines 20-21, "sub- strate of the substrate" should read --substrate--.

COLUMN 12

Line 38, "quantity" should read --quality--.

COLUMN 13

Line 20, "chamber 14" should read --chamber 314--.

COLUMN 16

Line 1, "function" should read --functions--.
Line 4, "12" should read --312--.
Line 22, "metal 10000 Å/min." should read --metal such as Al, Al-Si, etc. at a deposition speed of about 10000 Å/min.--.

UNITED STATES PATENT AND TRADEMARK OFFICE
CERTIFICATE OF CORRECTION

PATENT NO. : 5,306,934

DATED : April 26, 1994

INVENTOR(S) : YUZO KATAOKA, ET AL.

It is certified that error appears in the above-identified patent and that said Letters Patent is hereby corrected as shown below:

COLUMN 16

Line 42, "is" should be deleted.
    Line 50, "0.25 µm c 0.25 µm square" should read
        --0.25 µm × 0.25 µm square--.

COLUMN 17

Line 38, "used" should read --used for--.

COLUMN 18

Line 12, "abbreviates" should read --abbreviated--.
    Line 31, "(Al-si)," should read --(Al-Si),--.

Signed and Sealed this

Twenty-seventh Day of September, 1994

Attest:

BRUCE LEHMAN

*Attesting Officer*      *Commissioner of Patents and Trademarks*